United States Patent [19]

Verbanets

[11] Patent Number: 4,815,002
[45] Date of Patent: Mar. 21, 1989

[54] OBTAINING A SELECTED FREQUENCY COMPONENT IN RECTANGULAR COORDINATES FROM A SET OF ELECTRICAL WAVEFORMS

[75] Inventor: William R. Verbanets, Plum Borough, Pa.

[73] Assignee: Westinghouse Electric Corp., Pittsburgh, Pa.

[21] Appl. No.: 149,238

[22] Filed: Jan. 27, 1988

[51] Int. Cl.$^4$ ............... G01R 21/06; G01R 23/00
[52] U.S. Cl. .................... 364/484; 364/483; 364/492; 324/77 R
[58] Field of Search .......... 364/484, 492, 483; 324/76 R, 77 R

[56] References Cited

U.S. PATENT DOCUMENTS

| | | | |
|---|---|---|---|
| 4,581,705 | 4/1986 | Gilker et al. | 364/492 |
| 4,672,501 | 6/1987 | Bilac et al. | 361/96 |
| 4,730,257 | 3/1988 | Szeto | 364/484 |

OTHER PUBLICATIONS

IEE Tutorial Course, Computer Relaying; Chapters III-V, 1979.

*Primary Examiner*—Emanuel S. Kemeny
*Attorney, Agent, or Firm*—B. R. Studebaker

[57] ABSTRACT

In polyphase systems with a set of waveforms, such as a three-phase power system, each waveform is Fourier analyzed for a frequency component: A single sample/hold circuit samples each waveform sequentially, and the sampling time difference is compensated by adjusting the sampled values to a common time-point, using vector rectangular coordinate sine/cosine processing.

12 Claims, 3 Drawing Sheets

OBTAINING A SELECTED FREQUENCY COMPONENT IN RECTANGULAR COORDINATES FROM A SET OF ELECTRICAL WAVEFORMS

BACKGROUND OF INVENTION

1. Field of Invention

This invention relates to extracting a selected frequency component in rectangular coordinates from each waveform of a set of electrical waveforms. More particularly, it is directed to a method and apparatus for obtaining the rectangular coordinates of a selected frequency component such as the 60 Hz component from voltage and current waveforms of a polyphase transmission line using the full cycle Fourier algorithm.

2. Background Information

In some applications it may be necessary to obtain polyphase voltage and current information in terms of rectangular coordinates or vectors. On such application is in certain transmission line relaying equipment where it is desirable to obtain 60 Hz three-phase voltage and current information in rectangular coordinates. One way of obtaining this information is to simultaneously sample each of the waveforms at equally spaced times in one power cycle. This technique is known as the "full cycle Fourier algorithm".

According to current practice of implementing this algorithm, each input signal representing the instantaneous analog value of one parameter (a voltage, or a current converted to a proportional voltage) is applied to a separate sample/hold circuit. The sample/hold circuit is typically an integrated circuit consisting of an input buffer, an output buffer and a switch. At the sample time, a microprocessor switches the sample/hold control line from sample to hold. The sample/hold circuits then contain the voltage applied to their inputs at the time the control line is switched. Next, the microprocessor sequentially selects each sample/hold output through the control lines of a multiplexer which sequentially applies the inputs to an analog to digital converter to digitize each selection for input to the microprocessors. Thus, while the samples are serially input to the microprocessor, they represent the instantaneous values of each of the sensed parameters at the same instant of time.

The microprocessor utilizes these samples in the execution of the full cycle Fourier algorithm. An essential feature to this technique is that all of the waveforms are sampled simultaneously. This requires a separate sample and hold circuit for each parameter.

It is the primary object of the present invention to reduce the hardware required to extract a selected frequency component in rectangular coordinates from a set of electrical waveforms.

It is a further object of the present invention to achieve this primary object through a novel method and apparatus for implementing the full cycle Fourier algorithm.

SUMMARY OF THE INVENTION

These and other objects are realized by the invention in which a selected frequency component is obtained from each waveform of a set of electrical waveforms in terms of a vector representation. Periodically during a plurality of sampling periods, samples of the instantaneous analog amplitudes of the waveforms are generated by sequentially, at instants separated in time, sampling in order the instantaneous analog amplitude of each of the respective waveforms. These samples are digitized and stored to generate digitized samples. A conventional waveform analysis algorithm is applied to the stored digital samples, with adjustment made for the time between the instants when the samples of each respective waveform are generated during each sampling period, to obtain the selected frequency component from each waveform in terms of a vector representation.

Samples of the respective waveforms are generated sequentially by time multiplexing the instantaneous analog amplitude of each waveform in the set of waveforms to a single sample/hold circuit for conversion to a digital sample for storage, thus reducing the hardware required. The sequential sampling of the waveform amplitudes requires an adjustment in the waveform analysis algorithm to compensate for the difference in time that the samples are generated for each waveform, so that proper phase relation of the waveform vectors can be established.

Preferably, the conventional waveform analysis algorithm is the full wave Fourier algorithm. This algorithm which correlates the digitized samples of the instantaneous analog amplitude of each waveform with reference sine and cosine waves, generates a vector representation of each waveform in rectangular coordinates.

Also preferably, the instantaneous amplitudes of the set of waveforms is sampled sequentially during each sampling period at instants in time separated by preselected time intervals of equal duration. The full cycle Fourier algorithm is adjusted in this instance for the number of such intervals between instants when the samples of the respective waveforms are generated during each sampling period.

In the exemplary embodiment of the invention, digital samples of the reference sine and cosine waves are stored for each instant, separated by the selected time intervals, that instantaneous analog amplitude samples of the waveform are generated. The full cycle Fourier algorithm is adjusted by selecting for correlating each waveform the stored reference sine and cosine wave samples associated with the instants in time when samples for the waveform are generated.

The invention is implemented by a multiplexer which time multiplexes the instantaneous analog amplitudes to a single sample/hold circuit for sequential conversion to a digital sample by an analog to digital converter. The digital samples are stored for use by a digital computer which is programmed to apply the waveform analysis algorithm, preferably the full wave Fourier algorithm, to the digital samples with adjustment for the number of intervals between the instants when the samples of the respective waveforms are generated.

The invention embraces both the method and apparatus for obtaining the selected frequency component from each waveform of a set of electrical waveforms.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENT

The invention will be described as applied to extracting the 60 Hz component from the voltage and current waveform of a polyphase transmission line in terms of rectangular coordinates or vectors, but it will be appreciated by those skilled in the art that the invention has utility in obtaining the magnitude and phase angle of any selected frequency component from any set of electrical waveforms.

Figure 1:
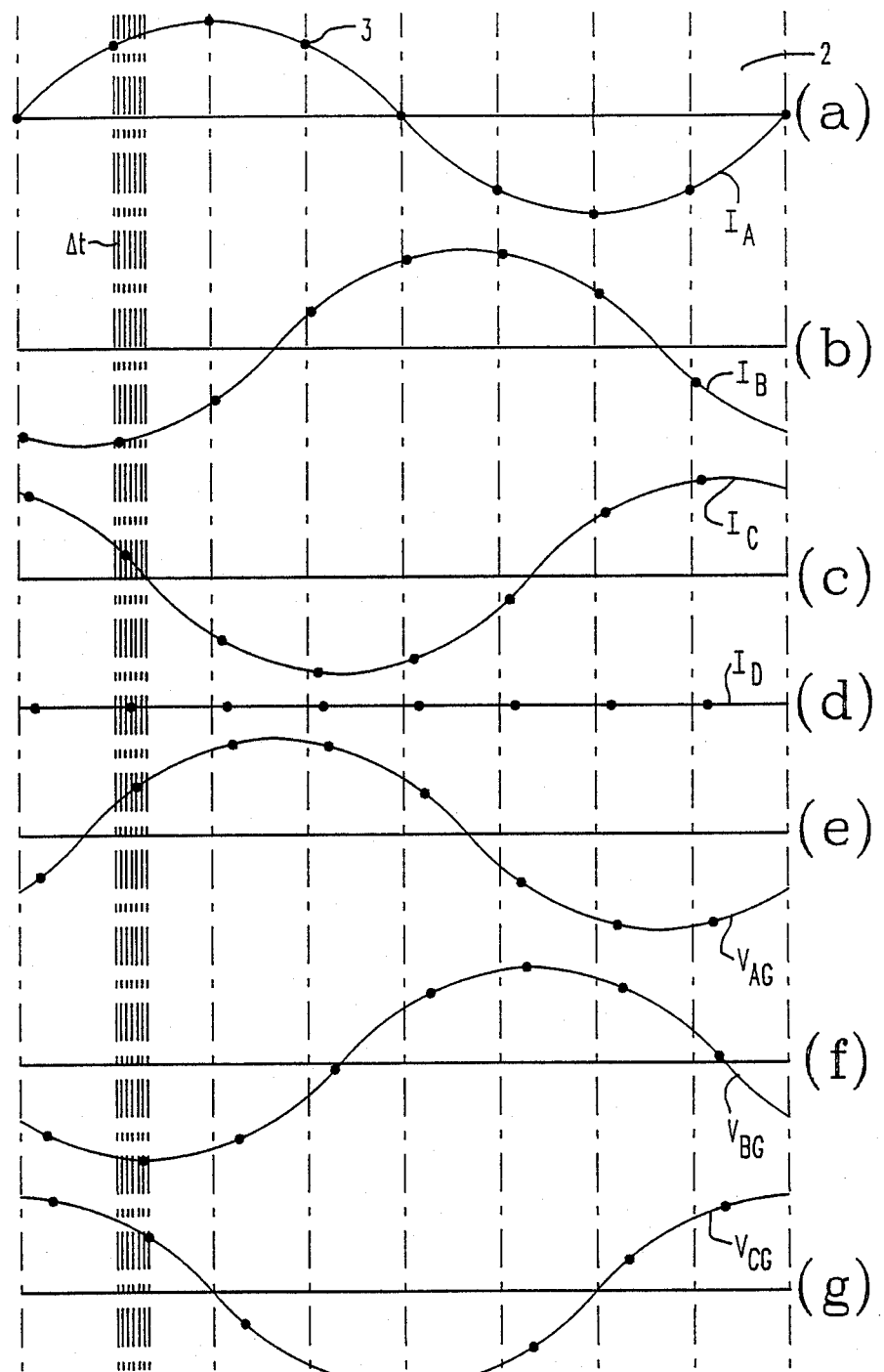
FIGS. 1a–g illustrate typical waveforms in a three-phase transmission line from which selected frequency components are obtained in accordance with the invention.

FIG. 1 illustrates the waveform patterns of seven parameters which are monitored in certain protective relaying systems for a three-phase electric power transmission line. These parameters include: the current in each phase $I_A$, $I_B$ and $I_C$ represented by FIGS. 1a, b and c respectively. These currents are sensed by current transformers and converted to proportional voltages as is well known. FIG. 1d illustrates the zero sequence current which is measured by known devices and also is presented as a proportional voltage. FIGS. 1e, f and g illustrate representative waveforms for the three phase to ground voltages $V_{AG}$, $V_{BG}$ and $V_{CG}$ respectively for the three-phase transmission line. The waveforms shown represent a normal balanced condition in which the zero sequence current is zero. Under fault conditions the currents would be unbalanced and for a ground fault there would be 60 Hz zero sequence current.

In order to generate a vector representation of these monitored waveforms, so that the relative magnitudes and phases of the seven parameters are available for protective relaying purposes, the full cycle Fourier algorithm is utilized. This algorithm correlates data samples for each waveform with stored samples of reference sine and cosine waves of the desired frequency; in this case 60 Hz. In accordance, with this algorithm, the real component of a voltage vector is found from:

$$V_R = \frac{2}{N} \sum_{X=0}^{N-1} V_x \cos\left(\frac{2\pi}{N} X\right) \qquad \text{Eq. 1}$$

where:
$V_R$ = real component
N = number of samples taken during a full cycle of the reference waveforms
$V_X$ = value of sample X
X = sample number
and the imaginary component is found from:

$$V_I = \frac{2}{N} \sum_{X=0}^{N-1} V_x \sin\left(\frac{2\pi}{N} X\right) \qquad \text{Eq. 2}$$

The result is:

$$V = V_R + jV_I \qquad \text{Eq. 3}$$

These calculations are made for each of the parameters from which the 60 Hz component is to be extracted N times during a full cycle. In order to maintain the proper phase relation between the waveforms of the seven parameters, prior practice has been to simultaneously sample each of the parameter waveforms at each of the N sampling periods. This has been accomplished as mentioned by using a separate sample/hold circuit for each of the parameters with all of these sample/hold circuits being controlled by the same control signal to store values of the seven waveforms at the same instant in time. This is repeated for each of the N samples taken of each waveform.

In accordance with the invention, data samples of the seven waveforms are generated, successively rather than simultaneously, N times per cycle. The N samples are taken during N sampling periods, 2, of equal duration at the instants represented by the dots, 3, on the waveforms of FIG. 1. In the example, eight samples are taken asynchronously at equally spaced sampling periods during each 60 Hz cycle.

The individual waveform values are sampled at fixed intervals, t, which are much shorter in duration than the N sample periods as can be seen from FIG. 1. In the exemplary system the intervals $\Delta t$ are of 70 microseconds duration. Thus, the value of the seventh waveform stored during each sampling period is taken 420 ($6 \times 70$) microseconds after the first. Since samples are taken 8 times per full cycle of the 60 Hz signals, or every 2 milliseconds, in the exemplary system, there is more than adequate time to serially read and store the values of the seven waveforms during each sampling period.

Figure 2A:
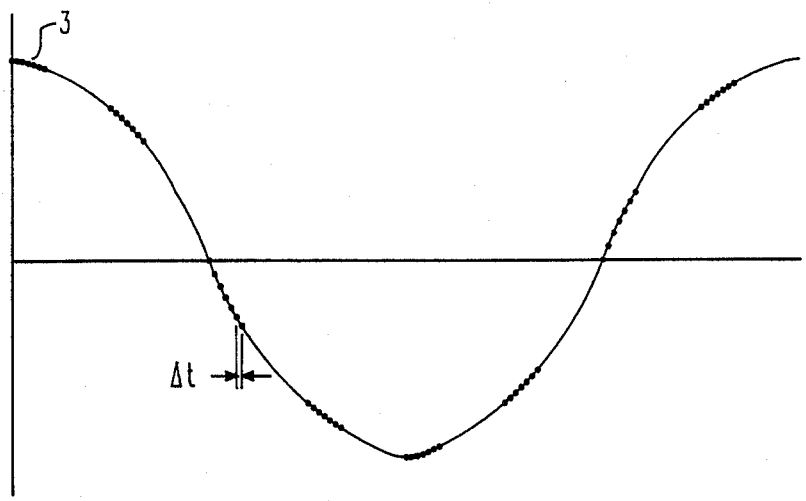
FIGS. 2a and b illustrate typical reference waveforms as adjusted in accordance with the invention to obtain the selected frequency components from the waveforms of FIG. 1.
Figure 2B:
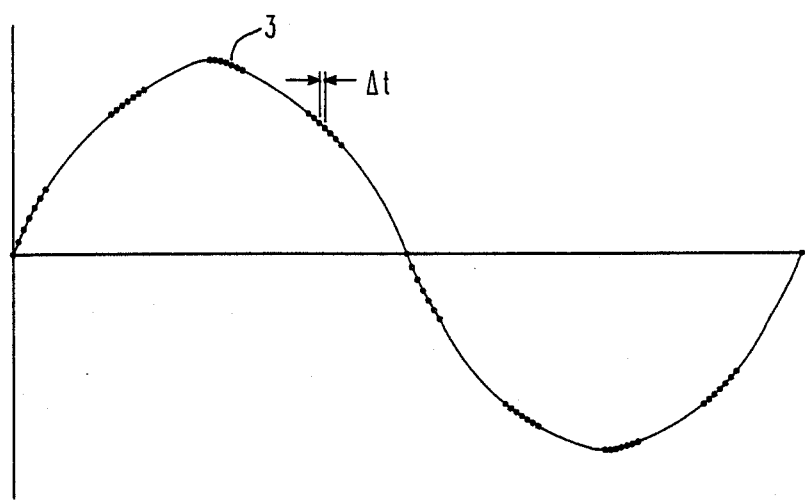

Adjustment is made in the full cycle Fourier algorithm for the difference in time at which the samples of the seven waveforms were successively generated. The adjustment is made to the reference sine and cosine waves by determining the value of these waveforms at the instant in time when the respective waveforms are sampled during each sampling period N. FIGS. 2a and b illustrate the reference cosine and sine waves respectively. As can be seen from these figures, values of the reference waves at successive points during each sampling period spaced by the intervals of time $\Delta t$ are selected for correlation with the measured samples of the respective current and voltage waveforms.

By way of example, consider the first sample of each waveform where $X=0$ in equations 1 and 2. For $I_A$, the first input, the instantaneous analog magnitude $V_x$ is multiplied by:

$$\cos\left(\frac{2\pi}{8} 0\right) = 1$$

for the first of eight terms needed to obtain the real part in accordance with equation 1 and by:

$$\sin\left(\frac{2\pi}{8} 0\right) = 0$$

for the first of eight terms needed to obtain the imaginary part in accordance with equation 2. Since $I_B$ is sampled 70 microseconds later, its instantaneous analog amplitude sample must be multiplied by:

$$\cos\left(\frac{2\pi}{8}0 + \frac{2\pi \times 70\mu S}{16.667\ MS}\right) = 0.9996$$

for the first of eight terms needed to determine the real part and by:

$$\sin\left(\frac{2\pi}{8}0 + \frac{2\pi \times 70\mu S}{16.667\ MS}\right) = 0.0264$$

for the first of eight terms of the imaginary part. The term:

$$\frac{2\pi \times 70\mu S}{16.667\ MS}$$

in the argument of the sin and cos terms of equations 1 and 2 is necessary to maintain the phasor relationship between $I_A$ and $I_B$. In other words, since $I_B$ is sampled 70 microseconds later with respect to $I_A$, the reference sine and cosine multiplication factors must be adjusted accordingly in order to maintain the proper angular relationship between the $I_A$ and $I_B$ vectors. The quantity $$\frac{2\pi \times 70\mu S}{16.667\ MS} = 0.0264$$

is the adjustment in radians to the sine and cosine functions. The denominator, 16.667 Ms is the duration of one cycle of the 60 Hz reference waves.

Since $I_C$ is sampled $2\Delta t = 140$ microseconds after $I_A$, the adjustment to the sine and cosine terms in equations 1 and 2 is:

$$\frac{2\pi \times 140\mu S}{16.667\ MS} = 0.0528$$

In general the Kth input must have its sine and cosine terms adjusted by:

$$\frac{2\pi\Delta t(K - 1)}{16.667}$$

Figure 3:
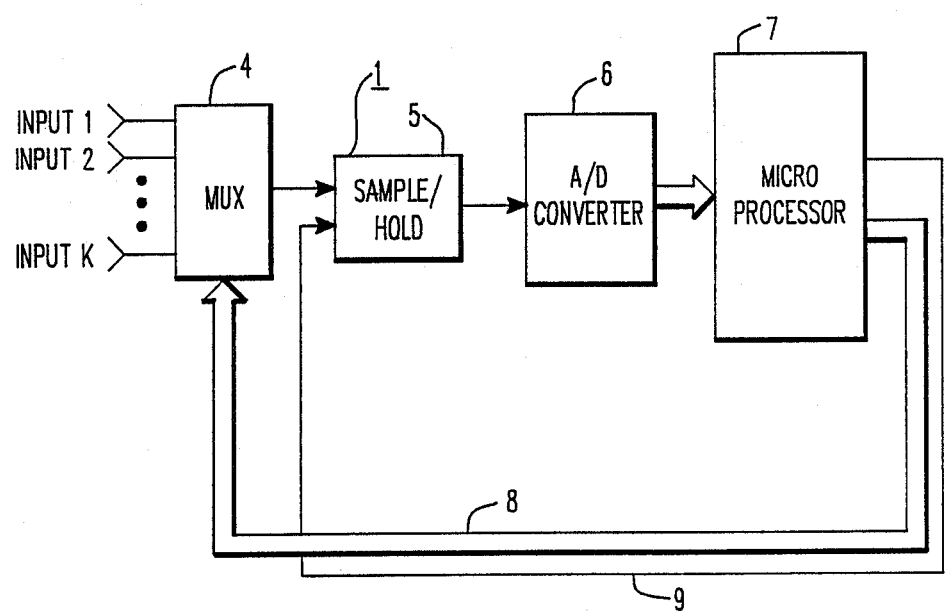
FIG. 3 is a block diagram of device in accordance with the invention for obtaining vector representations of the set of the waveforms of FIG. 1.

A block diagram of a system in accordance with the invention is shown in FIG. 3. Input signals 1 through K, the analog current and voltage signals in the exemplary system, are applied to a multiplexer 4. The multiplexer 4 selectively applies the input signals one at a time to a single sample/hold circuit 5. An analog to digital converter 6 digitizes the signal held by the sample and hold circuit for input to a microprocessor 7. The microprocessor controls the multiplexer 4 through a multiplexer channel select bus 8 and the sample/hold circuit 5 through sample/hold control line 9.

The microprocessor 7 controls the multiplexer 4 through multiplexer channel select bus 8 to sequentially, in order, apply the inputs to the single sample/hold circuit 5 and coordinates, through sample/hold control line 9, the operation of sample/hold circuit 5 to sample and hold the instantaneous magnitude of the applied input. The microprocessor 7 also controls conversion of the analog input signal to a digital signal by the A/D converter 6 and stores the digitized samples.

In addition to supervising generation of the digital samples of the instantaneous analog amplitudes of the input waveforms, the microprocessor 7 implements the full cycle Fourier algorithm. The algorithm is adjusted for the intervals between the instants when the digital waveform samples are generated during each sampling period by storing the values of the reference sine and cosine functions fo each of the instants during a cycle when a sample is generated. Thus, in the exemplary system where seven waveforms are each sampled eight times during a cycle of the reference sine and cosine wave, 56 values each of the sine and cosine functions are stored in a lookup table stored in the microprocessor's program memory. The microprocessor then adjusts the full cycle Fourier algorithm by correlating each waveform sample with the reference values appropriate for the particular input and the sampling period in which that input was generated.

The invention provides an economical means for generating vector representations of the waveforms in a set of electrical waveforms. While a full cycle Fourier algorithm is used in the exemplary system, less than a full cycle Fourier algorithm can be used for faster generation of the vector representation, but with reduced accuracy. Also, other algorithms could be used with the invention and the vector representations could be generated in polar rather than rectangular coordinates if desired.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the appended claims and any and all equivalents thereof.

What is claimed is:

1. In a method of obtaining a selected frequency component from each waveform of a set of electrical waveforms in terms of a vector representation comprising the steps of: sensing the instantaneous analog amplitude of each of said waveforms, periodically during a plurality of sampling periods generating samples of said instantaneous analog amplitude of each waveform, digitizing and storing said samples of said instantaneous analog amplitudes to generate stored digital samples, and applying a conventional waveform analysis algorithm to said stored digital samples to obtain the selected frequency components of each of said waveforms in terms of a vector representation, the improvement comprising; generating said samples of said instantaneous analog amplitudes of said waveforms during each sampling period by sequentially, at instants separated in time, sampling in order the instantaneous analog amplitude of each of said respective waveforms, and adjusting said conventional waveform analysis algorithm for the time between the instants when the samples of each respective waveform are generated during each sampling period.

2. The method of claim 1 wherein sequentially generating samples of the instantaneous analog amplitude of each waveform comprises time multiplexing the instantaneous analog amplitudes of the set of waveforms to a single sample/hold circuit at said sequential instants in time.

3. The method of claim 1 wherein said conventional waveform analysis algorithm is a Fourier algorithm which correlates for each waveform the stored digital samples generated during each sample period with reference sine and cosine waves of the selected frequency to generate said vector representation in rectangular coordinates, and wherein said Fourier algorithm is adjusted for each of the waveforms by adjusting the reference sine and cosine waves for the difference in time between when the samples of each waveform are generated.

4. The method claim 1 wherein generating said samples of said instantaneous analog amplitudes of said set of waveforms comprises said sequentially sampling in order the amplitude of each of said respective waveforms at instants in time separated by preselected time intervals of equal duration, and wherein adjusting said conventional waveform analysis algorithm comprises adjusting said algorithm for the number of said time intervals between the instants when the samples of the respective waveforms are generated during each sampling period.

5. The method of claim 4 wherein said conventional waveform analysis algorithm is a full cycle Fourier algorithm which correlates for each waveform the stored digital samples generated during each sample period of a full cycle of the selected frequency with reference sine and cosine waves of the selected frequency to generate said vector representation in rectangular coordiantes, and wherein said full cycle Fourier algorithm is adjusted for each of the waveforms by adjusting the reference sine and cosine waves by the number of intervals between the instants when the samples of the respective waveforms are generated.

6. The method of claim 5 wherein digital samples of the reference sine and cosine waves are stored for each instant separated by said time intervals during each sampling period that instantaneous analog amplitude samples of said waveforms are generated, and wherein said full cycle Fourier algorithm is adjusted by selecting for correlating each waveform the stored digital samples of the sine and cosine waves associated with the instants in time when said samples for the waveform are generated.

7. The method of claim 6 wherein sequentially sampling the instantaneous analog amplitude of each waveform comprises time multiplexing the instantaneous analog amplitude of the set of waveforms to a sample/hold circuit at preselected intervals.

8. A method of obtaining the 60 Hz components from selected waveforms of a three-phase electric power transmission line in rectangular coordinates comprising the steps of: sensing the instantaneous analog amplitude of each of said selected waveforms, periodically during a plurality of sampling periods in a 60 Hz cycle sequentially sampling at instants separated by a preselected number of intervals of time the instantaneous analog amplitudes of said selected waveforms, digitizing and storing said samples of said instantaneous analog amplitudes to generate stored digital waveforms samples, correlating the stored digital waveforms samples for each waveform for each period with stored digital reference samples of reference 60 Hz sine and cosine waves using a full cycle Fourier algorithm in which the reference sine and cosine wave digital samples are adjusted relative to the respective waveforms by the number of said intervals between the instants that the digital samples for the respective waveforms are generated.

9. The method of claim 8 including digitally storing reference samples of said 60 Hz reference sine and cosine waves for each instant during each sampling period that instantaneous analog amplitude samples of said waveforms are generated and wherein said full cycle Fourier algorithm is adusted by selecting for correlating each waveform the digitally stored reference samples of the sine and cosine waves associated with the instants in time that said instantaneous analog amplitude samples for the waveform are generated.

10. Apparatus for obtaining a selected frequency component in rectangular coordinates from each waveform of a set of electrical waveforms comprising:
   means for periodically during plural sampling periods in a cycle of said selected frequency, sequentially generating at instants separated by intervals of preselected duration digital samples of the instantaneous analog amplitude of each waveform; and
   a microprocessor programmed to apply a conventional waveform analysis alorithm to said digital waveform samples and to adjust said conventional algorithm for the intervals between the instants at which the digital samples of the respective digital waveform samples are generated to obtain the selected frequency component from each waveform in rectangular coordinates.

11. The apparatus of claim 10 wherein said microprocessor is programmed to apply a full cycle Fourier algorithm to said digital waveform samples by correlating said digital waveform samples with reference sine and cosine waves adjusted for each waveform by the number intervals between sequential generation of the digital waveform samples of said respective waveforms.

12. The apparatus of claim 11 wherein said means for generating digital waveform samples comprises:
   means for generating instantaneous analog amplitude signals for each waveform;
   a sample/hold circuit for sampling and holding an applied signal;
   a multiplexer connected to selectively apply one at a time the instantaneous analog amplitude signals to said sample/hold circuit; and
   an analog to digital converter converting the instantaneous analog amplitude signal stored in the sample/hold circuit to a digital waveform signal and applying said digital waveform signal to said microprocessor;
   said microporcessor being further programmed to periodically during plural sampling periods in a cycle of said selected frequency, controlling said multiplexer to sequentially at said instants separated by intervals of said preselected duration to apply the instantaneous analog amplitude signals to said sample/hold circuit, and to control said sample/hold circuit to store the applied instantaneous analog amplitude signal at said intervals for convertion to said digital waveform samples by said analog to digital converter.

* * * * *